(12) United States Patent
Lee et al.

(10) Patent No.: US 7,788,443 B2
(45) Date of Patent: Aug. 31, 2010

(54) TRANSPARENT MULTI-HIT CORRECTION IN ASSOCIATIVE MEMORIES

(75) Inventors: Michael J. Lee, Austin, TX (US); Vinod Ramadurai, South Burlington, VT (US); Bao G. Truong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 638 days.

(21) Appl. No.: 11/609,416

(22) Filed: Dec. 12, 2006

(65) Prior Publication Data

US 2008/0140924 A1    Jun. 12, 2008

(51) Int. Cl.
G06F 13/00 (2006.01)
G06F 13/28 (2006.01)
G06F 11/00 (2006.01)
G11C 15/00 (2006.01)

(52) U.S. Cl. .................. 711/108; 714/1; 365/49.17
(58) Field of Classification Search .................. 711/108
See application file for complete search history.

(56) References Cited

U.S. PATENT DOCUMENTS 5,893,931 A * 4/1999 Peng et al. .................. 711/206
7,092,270 B2 8/2006 Lee et al.
7,120,732 B2 10/2006 Braceras et al.
2002/0009009 A1 1/2002 Ahmed et al.
2008/0140925 A1 6/2008 Lee et al.

OTHER PUBLICATIONS

U.S. Appl. No. 11/609,464, filed Dec. 12, 2006, Lee et al.
USPTO U.S. Appl. No. 11/609,464, Image File Wrapper printed from PAIR Apr. 9, 2010, 2 pages.

* cited by examiner

*Primary Examiner*—Pierre-Michel Bataille
*Assistant Examiner*—Edward J Dudek
(74) *Attorney, Agent, or Firm*—Francis Lammes; Stephen J. Walder, Jr.; Diana R. Gerhardt

(57) ABSTRACT

A mechanism is provided for transparent multi-hit correction in associative memories. A content associative memory (CAM) device is provided that transparently and independently executes a precise corrective action in the case of a multiple hit being detected. The wordlines of a CAM array are modified to include a valid bit storage circuit element that indicates whether or not the corresponding wordline is valid or not. In operation, if multiple hits are detected, the multiple hit is signaled to the host system and the particular entries in the CAM array corresponding to the multiple hits are invalidated by setting their associated valid bit storage circuit elements to an invalid value or clearing the value in the associated valid bit storage circuit element. Any data returned to the host system as a result of the multiple hits is invalidated in the host system in response to the signaling of the multiple hits.

18 Claims, 6 Drawing Sheets

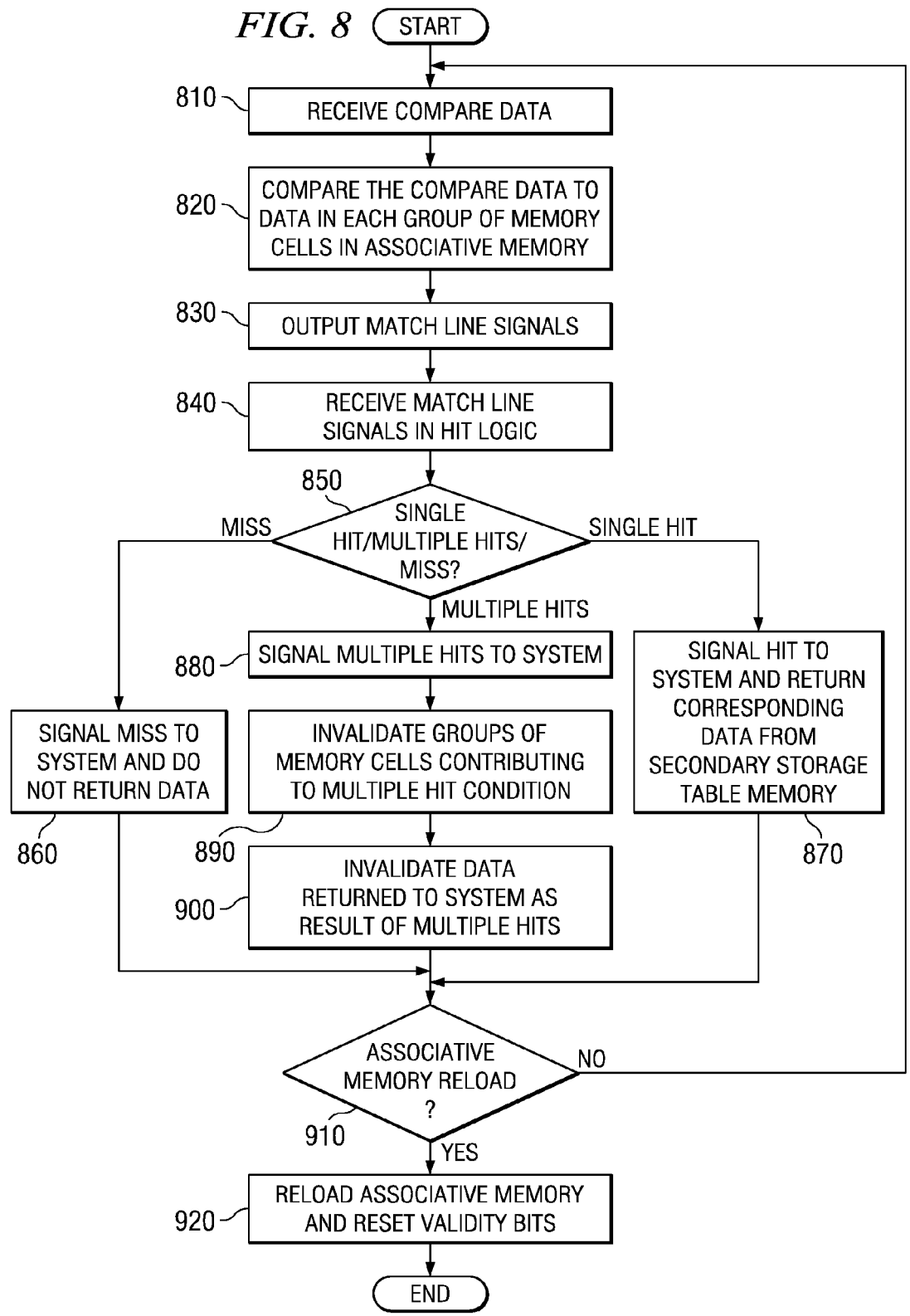

TRANSPARENT MULTI-HIT CORRECTION IN ASSOCIATIVE MEMORIES

BACKGROUND

1. Technical Field

The present application relates generally to an improved data processing device and method. More specifically, the present application is directed to an apparatus and method for transparent multiple hit correction in associative memories.

2. Description of Related Art

A content addressable memory (CAM) is a type of associative memory having an individual logic circuit associated with each memory cell or CAM entry. The individual logic circuits of each memory cell allow for simultaneously comparing the contents of each memory cell of the CAM in a single memory cycle. Because the entire contents of the CAM memory can be searched in one memory cycle, such memories may perform fast searches. CAM memory is especially useful for cache memory as a lookup table to point to an information location for information stored in conventional RAM (random access memory) memory, for example.

FIG. 1 illustrates an example of a known CAM array 100 comprising multiple memory cells 110. The CAM array 100 may be used for various purposes in which quick searching of multiple entries is desirable. For example, CAM arrays are typically used to provide address translation or address resolution, such as for cache accesses.

The memory cells 110 are arranged as an array having rows 120 and columns 130. The rows 120 of the CAM array 100 may sometimes be referred to as "word lines." The memory cells 110 in a particular row 120 are connected to one another by a match line 114. The match lines 114 of each row 120 are also connected to a hit logic circuit 140 which receives the output from the rows of memory cells 110 and determines which rows result in a match or "hit." The memory cells 110 in a particular column 130 are connected to one another by search lines 134. The search lines 134 couple the output of the search drivers 150 to the input of the memory cells 110. An output 142 of the hit logic circuit 140 is connected to the input of a secondary storage table memory 160, which may be a RAM, SRAM, or the like, which receives the outputs from the hit logic circuit 140 and outputs a corresponding data entry. The hit logic circuit 140 may also output a hit/miss signal 144 to indicate whether there was a hit detected or not.

In operation, the match lines 114 are pre-charged to a high state in preparation for a next search cycle. The search drivers 150 input the search data into the CAM array 100 through the search lines 134. This search data may be, for example, an input address for address translation or resolution. If the memory cell 110 does not contain the target data, the memory cell 110 causes its associated match line 114 to discharge to ground. If the contents of a particular cell 110 match the applied data received, along its search line 134, the memory cell 110 will allow its match line 114 to remain high. Thus, if all the memory cells 110 in a row 120 match the search data received on the search lines 134, the match line 114 of that row 130 remains high indicating a match. Otherwise, the match line 114 is discharged to ground indicating a mismatch or miscompare, in at least one of the cells 110 on the match line 114.

Based on the particular row 120 in the array 100 that that indicates a "hit," a corresponding row in the secondary storage table memory 160 is selected. That is, the data in the secondary storage table memory 160 may be indexed by the stored address table represented by the CAM array 100. The corresponding data in the secondary storage table memory 160 may then be output for use by the computing system in which the CAM array 100 is present. This is referred to as a "match read." The above operation may then be repeated for the next search cycle.

As noted above, a benefit of a CAM array is its ability to search all entries simultaneously. For example, a CAM array that has 1K entries can be searched in one cycle, while a standard memory (SRAM or DRAM) would typically require 1000 cycles to determine if the desired data is present.

However, one limitation of CAM systems is that, at most, only one word line stored in the device should be matched at a time. Nevertheless, a significant problem with existing CAM devices is that a circuit failure or software error external to the CAM device can cause the occurrence of multiple "hits." For example, in devices used in certain environments, radiation may cause soft error rate (SER) failures of the CAM device. As one example, alpha particles that are typically filtered out by Earth's atmosphere, may cause SER failures of CAM devices in applications where such filtering is not possible, such as in satellites, space vehicles, and other devices intended for use outside of Earth's atmosphere or at very high altitudes.

If a multiple hit condition exists, multiple word-lines are enabled in the CAM device and erroneous outputs are returned. That is, multiple data entries in the secondary storage table memory 160 are simultaneously accessed causing the resulting data output to be invalid. Even worse, data corruption in the secondary storage table memory 160 may result if the access involves shared read/write bitlines.

Since the cause of a multiple hit is unpredictable, the simplest course of action after detection is to invalidate the entire CAM array 100. However, as the CAM array 100 tries to repopulate with valid entries, the miss rate will temporarily rise and negatively impact performance.

Other solutions involve storing the incoming compare address that caused the multiple hit condition and then issuing an invalidate operation on that address in a subsequent cycle. With such a solution, the addresses are invalidated in a manner where these addresses would not be presented to the CAM array for comparison again after detecting that they result in a multiple hit condition. For example, if an address pattern "A" causes a multiple hit condition in the CAM array, the address pattern "A" is stored in a separate memory entity and compared with incoming address patterns in subsequent cycles. If address pattern "A" is seen again at some point in the future, it would not be presented to the CAM array for comparison since it was established in a previous cycle that this pattern causes a multiple hit condition.

While more precise, this solution can have adverse affects to performance as the CAM array 100 will be offline while performing the invalidate operation on the address pattern. In addition, there is the overhead of detecting a multiple hit failure in the CAM array 100 and reactively issuing an invalidate operation as well as comparing the address patterns for all subsequent cycles.

SUMMARY

The illustrative embodiments provide an apparatus and method for transparent multiple hit correction in associative memories. In one illustrative embodiment, a content associative memory (CAM) device is provided that transparently and independently executes a precise corrective action in the case of a multiple hit being detected.

In one illustrative embodiment, the wordlines of a CAM array are modified to include a valid bit storage circuit element that indicates whether or not the corresponding wordline is valid or not. Moreover, the CAM array comprises circuitry for setting a value of the valid bit storage circuit element in response to the detection of a multiple hit in the CAM array.

In operation, input data is received in the CAM array and a determination is made as to whether there is a single hit in the CAM array, multiple hits in the CAM array, or a miss in the CAM array. If a miss is detected, the miss is signaled to the host system with no data being returned to the host system. If a single hit is detected, then the hit is signaled to the host system and data corresponding to the wordline in which the hit occurred is returned to the host system.

If multiple hits are detected, the multiple hit is signaled to the host system and the particular entries in the CAM array corresponding to the multiple hits are invalidated by setting their associated valid bit storage circuit elements to an invalid value or clearing the value in the associated valid bit storage circuit element. Any data returned to the host system as a result of the multiple hits is invalidated in the host system in response to the signaling of the multiple hits.

Thereafter, if input data is received in the CAM array that matches an invalidated wordline, then a miss is signaled to the host system and data is not returned to the host system. Later, when the host system is in an idle period, or a period of reduced workload, the CAM array may be reloaded with valid data. In this way, the number of CAM array misses may be minimized due to the reduced activity in the host system and eliminating the need to reload the CAM array immediately in response to a multiple hit being detected.

In one illustrative embodiment, a method for handling multiple hits of an associative memory is provided. The method may comprise receiving compare data in the associative memory and detecting if a multiple hit condition in which more than one hit condition occurs in the associative memory, a hit condition being a condition in which data values stored in a group of memory cells in the associative memory matches the compare data. A valid bit, for each individual group of memory cells in the associative memory that contributed to the multiple hit condition, may be set to an invalid state indicating an associated group of memory cells is invalid. Based on the setting of the valid bits, individual groups of memory cells whose bits are set to an invalid state may be prevented from indicating a hit in subsequent searches of the associative memory.

The associative memory may be, for example, a content addressable memory (CAM). Moreover, detecting if a multiple hit condition occurs in the associative memory may comprise detecting whether more than one matchline of the associative memory remains at a high voltage state after comparing the compare data to the data values stored in memory cells of the associative memory.

The method may further comprise outputting a multiple hit signal to a data processing device to thereby inform the data processing device that a multiple hit condition has been detected. Moreover, the method may comprise invalidating, in the data processing device, data read out of a secondary storage in response to receiving the multiple hit signal.

The method may further comprise reloading the associative memory and resetting the valid bits associated with each group of memory cells in the associative memory to indicate a valid state in response to reloading of the associative memory. The reloading of the associative memory may be performed in response to determining that the data processing device is one of idle or at a sufficiently low usage level.

The method may further comprise receiving additional compare data in the associative memory, comparing the additional compare data to each individual group of memory cells in the associative memory that contributed to the multiple hit condition, and detecting a match condition of at least one of the individual group of memory cells in the associative memory that contributed to the multiple hit condition. Moreover, the method may comprise determining if a valid bit associated with the at least one of the individual group of memory cells has been previously set and converting the detected match condition to a non-match condition if the valid bit associated with the at least one of the individual group of memory cells has been previously set.

In yet another illustrative embodiment, an associative memory device is provided that comprises a plurality of groups of memory cells, a plurality of valid bit storage devices, one valid bit storage device associated with each group of memory cells in the plurality of groups of memory cells, multiple hit detection logic coupled to the plurality of groups of memory cells, and invalidation logic coupled to the valid bit storage devices associated with the groups of memory cells. The associative memory device may be a content addressable memory (CAM).

With this associative memory device, compare data is received in the associative memory and the multiple hit detection logic detects a multiple hit condition if more than one hit condition occurs in the associative memory, a hit condition being a condition in which data values stored in a group of memory cells, of the plurality of groups of memory cells in the associative memory, matches the compare data. The invalidation logic sets a valid bit for each individual group of memory cells in the associative memory that contributes to the multiple hit condition, in an associated valid bit storage device, to an invalid state indicating that the associated group of memory cells is invalid. Based on the setting of the valid bits, individual groups of memory cells whose valid bits are set to an invalid state are prevented from indicating a hit in subsequent searches of the associative memory. The multiple hit detection logic may detect a multiple hit condition by detecting whether more than one matchline of the associative memory remains at a high voltage state after comparing the compare data to the data values stored in memory cells of the associative memory.

The associative memory may output a multiple hit signal to a data processing device with which the associative memory is associated to thereby inform the data processing device that a multiple hit condition has been detected. The data processing device may invalidate data read out of a secondary storage in response to receiving the multiple hit signal.

The associative memory may be reloaded and the valid bits associated with each group of memory cells in the plurality of groups of memory cells are reset to indicate a valid state in response to reloading of the associative memory. The reloading of the associative memory may be performed in response to determining that a data processing device with which the associative memory is associated is one of idle or at a sufficiently low usage level.

With the associative memory device, additional compare data may be received in the associative memory and the additional compare data may be compared to each individual group of memory cells that contributed to the multiple hit condition. A match condition of at least one of the individual groups of memory cells that contributed to the multiple hit condition may be detected and a determination may be made as to whether a valid bit associated with the at least one of the individual group of memory cells has been previously set. The detected match condition may be converted to a non-match condition if the valid bit associated with the at least one of the individual group of memory cells has been previously set.

In another illustrative embodiment, a data processing device is provided that comprises a processor and an associative memory coupled to the processor. The associative memory may comprise logic that causes the associative memory to receive compare data in the associative memory and detect if a multiple hit condition in which more than one hit condition occurs in the associative memory occurs, a hit condition being a condition in which data values stored in a group of memory cells in the associative memory matches the compare data. The logic may further cause the associative memory to set, for each individual group of memory cells in the associative memory that contributed to the multiple hit condition, a valid bit to an invalid state indicating an associated group of memory cells is invalid. Moreover, the logic may further cause the associative memory to prevent, based on the setting of the valid bits, individual groups of memory cells whose valid bits are set to an invalid state from indicating a hit in subsequent searches of the associative memory.

The logic for detecting a multiple hit condition in the associative memory may comprise logic for detecting whether more than one matchline of the associative memory remains at a high voltage state after comparing the compare data to the data values stored in memory cells of the associative memory.

The associative memory may comprise logic for outputting a multiple hit signal to the processor to thereby inform the processor that a multiple hit condition has been detected. The processor may invalidate data read out of a secondary storage in response to receiving the multiple hit signal.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 8 is a flowchart outlining an exemplary operation of an associative memory in accordance with one illustrative embodiment.

DETAILED DESCRIPTION OF THE ILLUSTRATIVE EMBODIMENTS

The illustrative embodiments provide an apparatus and method for transparent multiple hit correction in associative memories, such as a content addressable memory (CAM). Such associative memories have various uses depending upon the data processing device in which they are utilized. It is not possible to detail every possible use of an associative memory herein. As one example, however, such associative memories may be utilized in caches of processors in data processing devices. Moreover, such associative memories may be used to perform address translation or resolution in various input/output adapters, interfaces, or the like.

Figure 1:
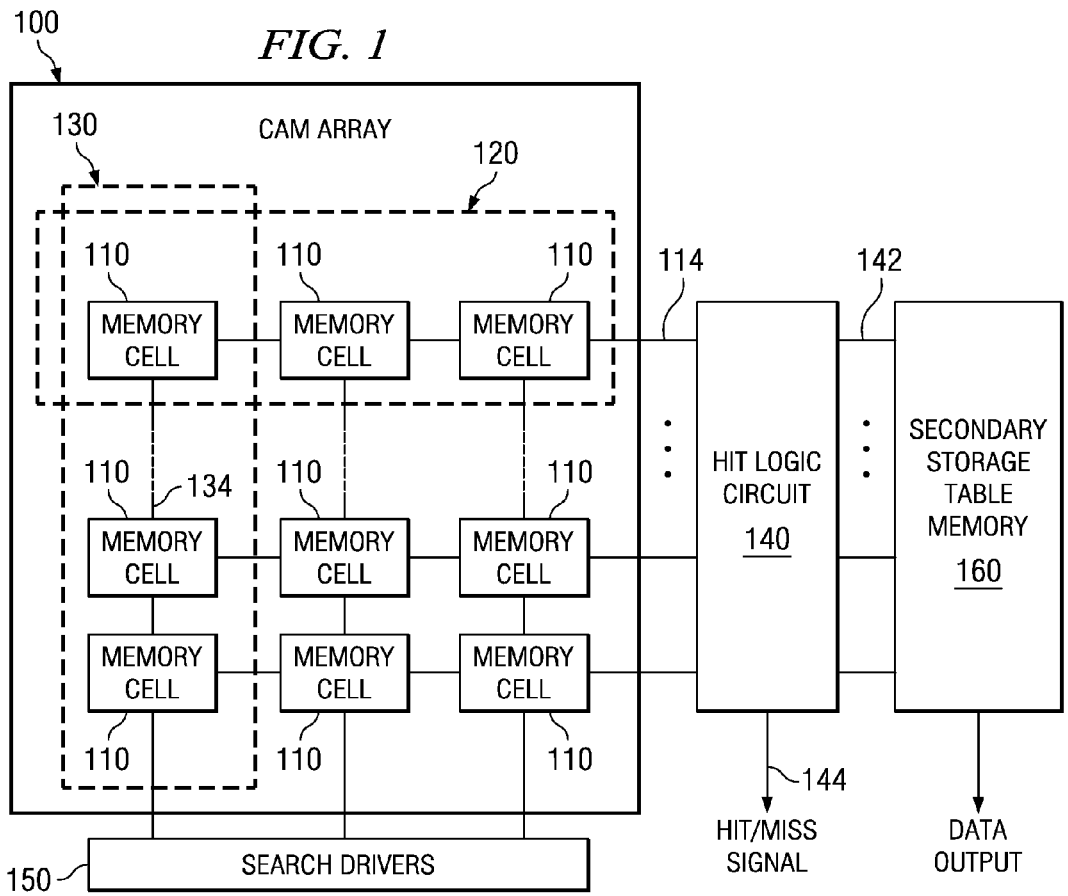
FIG. 1 is an exemplary block diagram of CAM array in accordance with a known architecture.
Figure 2:
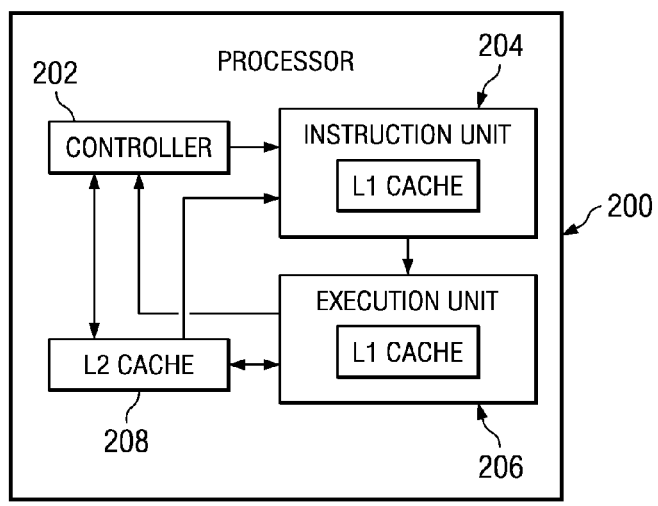
FIG. 2 is an exemplary block diagram of a processor in which an associative memory may be utilized in accordance with one illustrative embodiment.

FIG. 2 is provided as one example of a data processing environment in which an associative memory may be utilized, i.e. in a cache of a processor. FIG. 2 is only offered as an example data processing environment in which the aspects of the illustrative embodiments may be implemented and is not intended to state or imply any limitation with regard to the types of, or configurations of, data processing environments in which the illustrative embodiments may be used. To the contrary, any environment in which an associative memory may be utilized is intended to be within the spirit and scope of the present invention.

FIG. 2 is an exemplary block diagram of a processor 200 in accordance with an illustrative embodiment. Processor 200 includes controller 202, which controls the flow of instructions and data into and out of processor 200. Controller 202 sends control signals to instruction unit 204, which includes an L1 cache. Instruction unit 204 issues instructions to execution unit 206, which also includes an L1 cache. Execution unit 206 executes the instructions and holds or forwards any resulting data results to, for example, L2 cache 208. In turn, execution unit 206 retrieves data from L2 cache 208 as appropriate. Instruction unit 204 also retrieves instructions from L2 cache 208 when necessary. Controller 202 sends control signals to control storage or retrieval of data from L2 cache 208. Processor 200 may contain additional components not shown, and is merely provided as a basic representation of a processor and does not limit the scope of the present invention.

Those of ordinary skill in the art will appreciate that the hardware in FIG. 2 may vary depending on the implementation. Other internal hardware or peripheral devices, such as flash memory, equivalent non-volatile memory, or optical disk drives and the like, may be used in addition to or in place of the hardware depicted in FIG. 2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

The L1 cache and L2 cache 208 may be implemented using an associative memory, such as a content addressable memory (CAM), for example. Addresses may be supplied to the associative memory in which case every wordline of the associative memory is searched simultaneously to determine if any of the wordlines match the supplied address, i.e. there is a "hit" in the associative memory. If there is a match, a corresponding entry in the L1 or L2 cache 208 is read out and provided to an appropriate unit in the processor 200.

As mentioned above, in certain circumstances, multiple hits may be detected in the associative memory due to external software errors, circuitry failures, or the like. The illustrative embodiments provide mechanisms by which groups of memory cells, e.g., a wordline or row in an associative memory, such as a content addressable memory (CAM), may individually be flagged as being valid or not. If a group of memory cells is not valid, it is not included in the search of the associative memory and thus, cannot register a "hit" in the associative memory. Moreover, illustrative embodiments provide mechanisms for setting whether or not particular groups of memory cells are valid or not in response to the detection of a multiple hit in the associative memory.

In this way, individual groups of memory cells in the associative memory may be flagged as invalid and removed from further searching. At a later time, when the data processing device in which the associative memory is operating is idle or experiencing a sufficiently low usage, the associative memory may be reloaded and the previously invalid groups of memory cells may be loaded with valid data and reset to a valid state.

Figure 3:
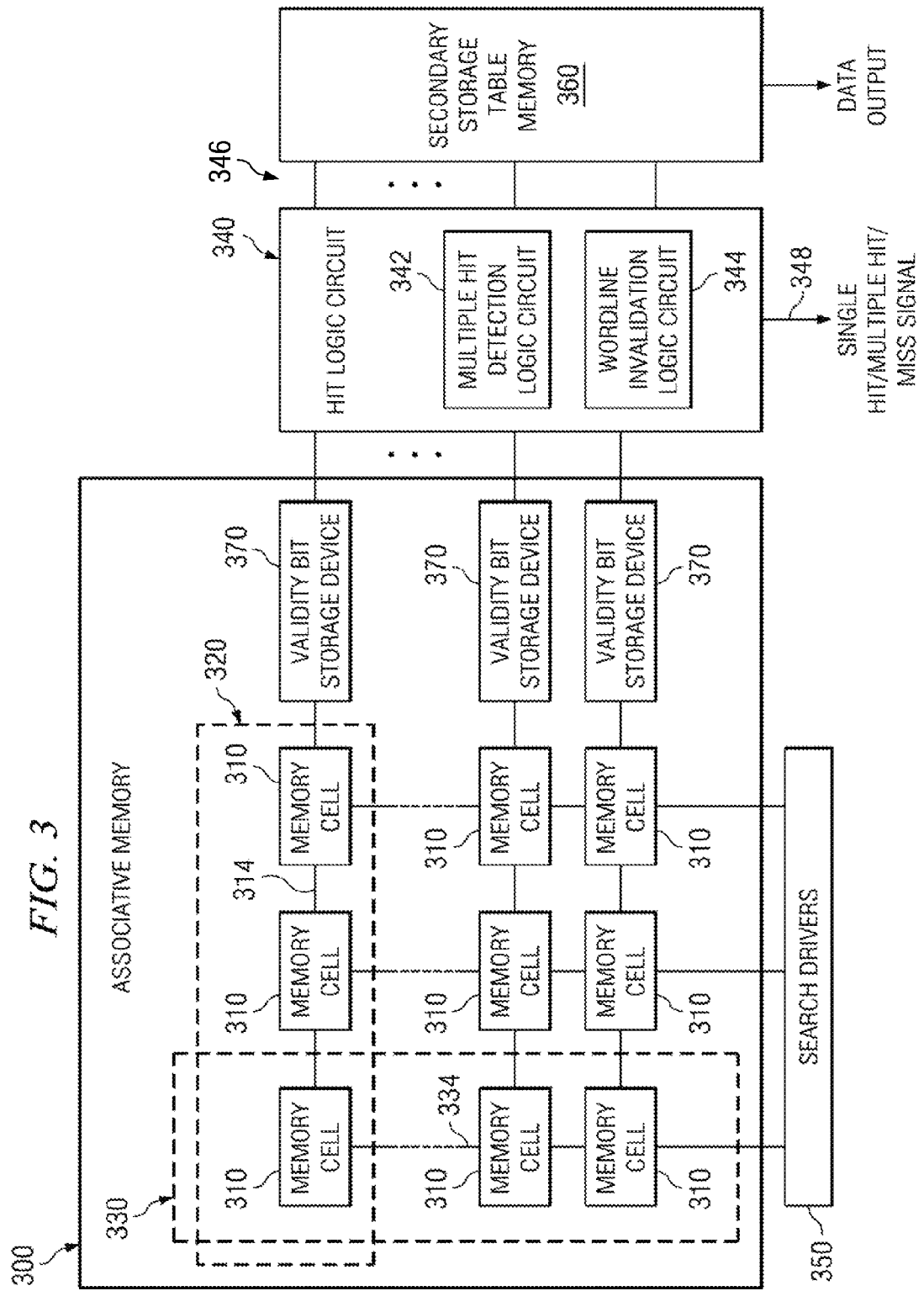
FIG. 3 is an exemplary block diagram of an associative memory structure in accordance with one illustrative embodiment.

FIG. 3 is an exemplary block diagram of an associative memory structure in accordance with one illustrative embodiment. In the depicted example, the associative memory structure is a content addressable memory (CAM), however the invention is not limited to such and any associative memory may be utilized.

As shown in FIG. 3, an associative memory 300 is comprised of a plurality of memory cells 310 arranged as an array having rows 320 and columns 330. The rows 320 of the associative memory 300 may sometimes be referred to as "wordlines." The memory cells 310 in a particular row 320 are connected to one another by a match line 314. The match lines 314 of each row 320 are also connected to a hit logic circuit 340 which itself includes multiple hit detection logic circuit 342 and wordline invalidation logic circuit 344.

The hit logic circuit 340 receives the output from the rows, i.e. wordlines, of memory cells 310 and determines which rows result in a match or "hit." The hit logic circuit 340 further determines, via the multiple hit detection logic circuit 342, if there is a multiple hit condition in the wordlines of the associative memory 300. The hit logic circuit 340 also sets validity bits in validity bit storage devices 370 associated with the wordlines of the associative memory 300 based on detected multiple hits, as discussed hereafter.

The memory cells 310 in a particular column 330 are connected to one another by search lines 334. The search lines 334 couple the output of the search drivers 350 to the input of the memory cells 310. An output 346 of the hit logic circuit 340 is connected to the input of a secondary storage table memory 360, which may be a RAM, SRAM, or the like, which receives the outputs from the hit logic circuit 340 and outputs a corresponding data entry. The hit logic circuit 340 may also output a hit/multi-hit/miss signal 348 to indicate, to the data processing device in which the associative memory 300 is provided, whether there was a hit detected, whether multiple hits were detected, or whether no hit was detected.

In operation, the match lines 314 are pre-charged to a high state in preparation for a next search cycle. The search drivers 350 input the search data into the associative memory 300 through the search lines 334. This search data may be, for example, an input address for address translation or resolution. If the memory cell 310 does not contain the target data, the memory cell 310 causes its associated match line 314 to discharge to ground. If the contents of a particular cell 310 match the applied data received, along its search line 334, the memory cell 310 will allow its match line 314 to remain high. Thus, if all the memory cells 310 in a row 320 match the search data received on the search lines 334. the match line 314 of that row 320 remains high indicating a match. Otherwise, the match line 314 is discharged to ground indicating a mismatch or miscompare, in at least one of the cells 310 on the match line 314.

Based on the particular row 320 in the array 300 that that indicates a "hit," a corresponding row in the secondary storage table memory 360 is selected. That is, the data in the secondary storage table memory 360 may be indexed by the stored address table represented by the associative memory 300. This secondary storage table memory 360 may be, for example, a RAM, SRAM, or the like, and may be used to store data for caching purposes, for address translation purposes, or any other purpose for which an associative memory 300 may be desirable to use. The corresponding data in the secondary storage table memory 360 may be output for use by the data processing device in which the associative memory 300 is present. This is referred to as a "match read." The above operation may then be repeated for the next search cycle.

In the above process for identifying hits in the associative memory 300, the hit logic circuit 340 further determines if multiple hits have occurred. That is, multiple hit detection logic circuit 342 determines if more than one wordline in the associative memory 300 remains at a high voltage state. If so, the hit logic circuit 340 sets or clears a valid bit, via the wordline invalidation logic circuit 344, associated with the wordlines that remain high to thereby invalidate these wordlines in subsequent searches. Moreover, the hit logic circuit 342 outputs a multiple hit output signal 348 to the data processing device to inform the data processing device that the output from the secondary storage table memory 360 is invalid.

In the depicted example, the validity bit storage device 370 is provided after the wordlines of the associative memory 300 but prior to the hit logic circuit 340. In such an arrangement, each wordline may still perform the compare operation but those wordlines that have been set to an invalid state by the value stored in their associated validity bit storage device 370 will not be considered by the hit logic circuit 340 when determining if a hit has occurred or not. It should be noted, however, that the illustrative embodiments are not limited to such an arrangement. To the contrary, in other illustrative embodiments, the validity bit storage device 370 may be configured into the associative memory 300 such that the compare operation is inhibited entirely for those wordlines that have been determined to be invalid in previous search cycles until the wordline is reloaded with valid data, such as through a reload of the associative memory.

Figure 4:
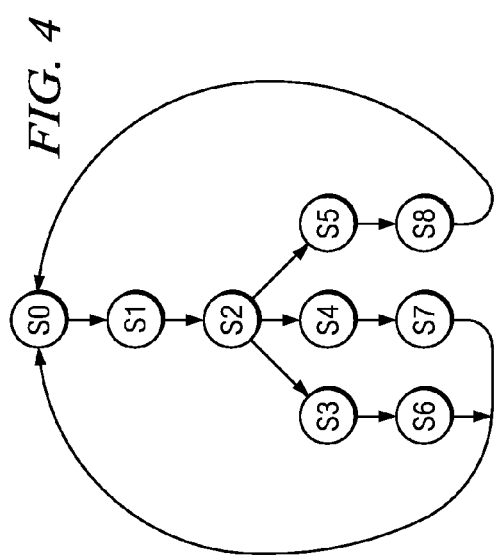
FIG. 4 is a state diagram illustrating an operation of an associative memory structure in accordance with one illustrative embodiment.

FIG. 4 is a state diagram illustrating an operation of an associative memory structure in accordance with one illustrative embodiment. The state diagram of FIG. 4 outlines the operation of the hit logic circuit in an associative memory structure according to one illustrative embodiment.

As shown in FIG. 4, the state diagram starts at an initial state S0 where, for example, a write operation or the like, may be submitted to the associative memory. The state transitions to state S1 where incoming compare data, e.g., an address, is presented to the associative memory and match/mismatch processing is started. The state then transitions to state S2 where a determination is made as to whether there is a miss, a single hit, or a multiple hit condition in the associative memory based on the incoming compare data.

If a miss condition is detected, the state transitions to state S3. The state then transitions to state S6 where the associative memory signals the miss to the data processing device in which the associative memory is provided and returns no data to the data processing device.

If a single hit condition is detected, the state transitions to state S4. The state then transitions to state S7 where the single hit is signaled to the data processing device in which the associative memory is provided and returns the corresponding data from the secondary storage table memory to the data processing device.

If a multiple hit condition is detected, the state transitions to state S5. The state then transitions to state S8 where the multiple hit condition is signaled to the data processing device in which the associative memory is provided. In addition, in state S8, the wordlines associated with the multiple hit are invalidated, and data from the secondary storage table memory is returned, but the multiple hit condition indicates to the data processing device that the returned data is invalid.

After states S6, S7, and S8, the states transition back to state S0. It should be noted that, while not depicted in FIG. 4, at some time later when the data processing device in which the associative memory is present is either idle or experiencing sufficiently low usage, the associative memory may be reloaded in a manner generally known in the art. During this reloading operation, the validity storage devices may be reset to a valid state such that all of the wordlines of the associative memory may again be used in searching and hit detection.

As discussed above, the illustrative embodiments provide additional logic, when compared to known associative memory structures, for detecting multiple hits and for invalidating wordlines that are involved in a multiple hit condition. Thus, additional circuit elements are added to the associative memory structure to provide this additional logic. To better illustrate the improvements of the illustrative embodiments over known associative memory mechanisms, a known memory access structure, which may be used with known associative memories, will first be described followed by a discussion of the added circuit elements according to one illustrative embodiment.

Figure 5:
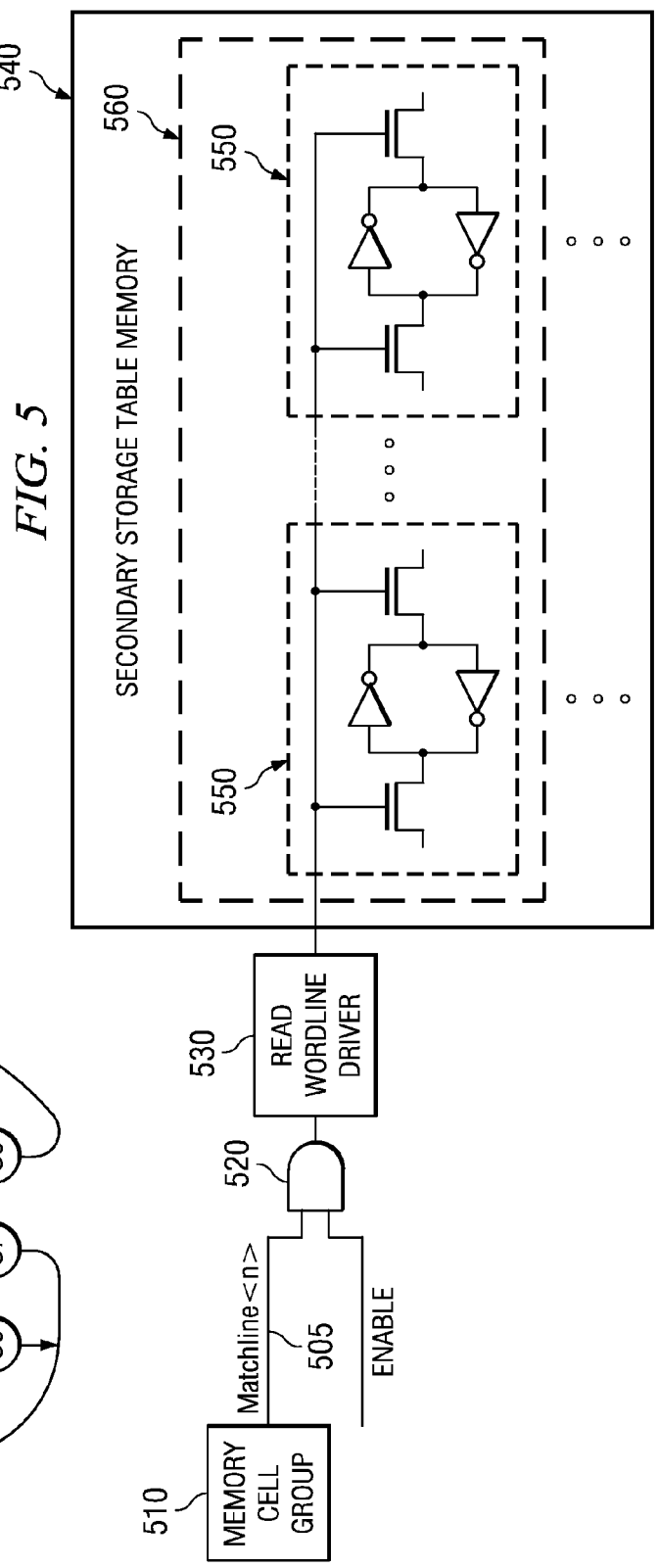
FIG. 5 is an exemplary diagram of a typical memory access structure in accordance with a known mechanism.

FIG. 5 is an exemplary diagram of a typical memory access structure in accordance with a known mechanism. As shown in FIG. 5, in a wordline 500 of an associative memory, such as a content addressable memory, the matchline output 505 of a group of memory cells 510 is input to an AND gate 520 along with an enable signal. As mentioned above, normally, the matchline output 505 is precharged to a logic high state before a compare action, and is cleared to a logic low state in the case of any bit mismatch during the comparison of bits in the memory cells of the wordline 500. The matchline output 505 remains high if the wordline's data entry matches the incoming compare data.

The AND gate 520 essentially AND's the enable signal with the matchline output 505 from the group of memory cells 510 and asserts a signal to the read wordline driver 530 in response to both the matchline and the enable signal being at a logic high state, i.e. a logic "1." The read wordline driver 530 drives a signal to the memory cells 550 of a corresponding entry 560 in the secondary storage table memory 540 to thereby cause the data values in the memory cells 550 of the corresponding entry 560 to output their values to the data processing device in which the memory access structure is provided.

Figure 6:
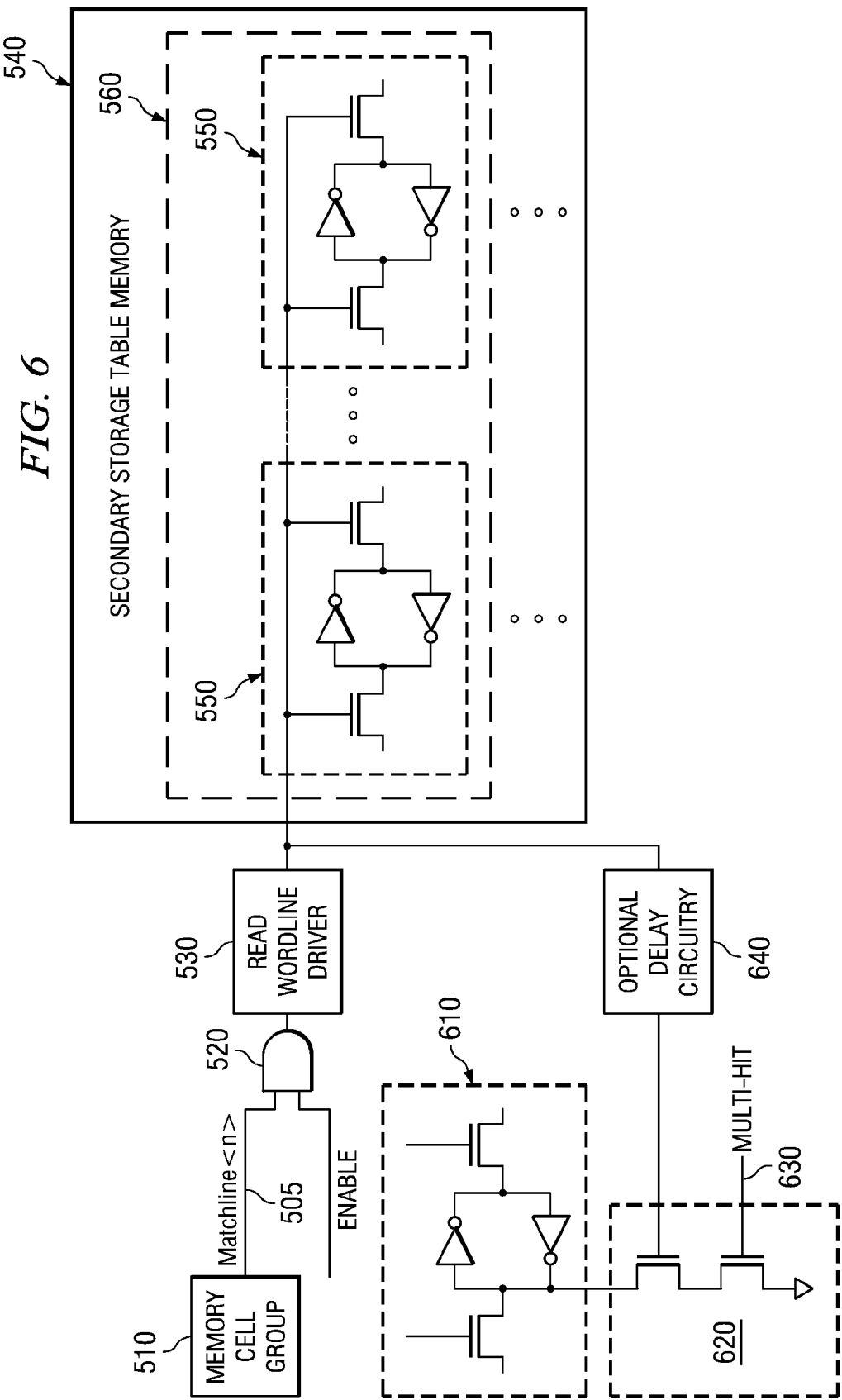
FIG. 6 is an exemplary diagram of a memory access structure in accordance with one illustrative embodiment.

FIG. 6 is an exemplary diagram of a memory access structure in accordance with one illustrative embodiment. As shown in FIG. 6, in addition to the conventional memory access structure shown in FIG. 5, the illustrative embodiment provides an additional valid bit storage circuit 610 for storing a value indicating whether or not the corresponding wordline in the associative memory structure is valid or not. This valid bit storage circuit 610 may be provided in such a manner as to modify one of the inputs to the AND gate 520 such that the AND gate 520 does not assert a signal to the read wordline driver 530 when the valid bit storage circuit 610 stores a value that indicates the wordline to be invalid. For example, the valid bit storage circuit 610 may be provided just prior to the AND gate 520 so as to drive low either the matchline output 505 or the enable signal when the valid bit storage circuit 610 stores a value indicative of an invalid state.

In one illustrative embodiment, the valid bit storage circuit 610 is pre-charged to a logic high level, i.e. the valid bit storage circuit 610 stores a logic "1" value, to thereby indicate that the associated wordline is valid. In response to a multiple hit signal 630 being asserted to the clear port 620 of the valid bit storage circuit 610, the valid bit storage circuit 610 is cleared to a logic low level, i.e. the valid bit storage circuit 610 stores a logic "0." The multiple hit signal 630 may be asserted by a multiple hit detection logic circuit, such as the multiple hit detection logic circuit 342, for example. The multiple hit detection logic circuit may detect when more than one wordline asserts a signal along its matchline to thereby activate the corresponding read wordline driver 530.

In addition to the multiple hit signal 630, an output of the read wordline driver 530 is provided to the clear port 620 of the valid bit storage circuit 610. If both the output of the read wordline driver 530 and the multiple hit signal 630 are asserted to the clear port 620, then the valid bit storage circuit 610 is cleared. In this way, only those valid bit storage circuits 610 associated with wordlines that contributed to the multiple hit condition are cleared, i.e. set to a logic low state (store a logic "0" value).

The path from the read wordline driver 530 to the clear port 620 of the valid bit storage circuit 610 may need additional delay if the multiple hit detection logic circuit is not fast enough and therefore, does not overlap the wordline driver signal long enough to clear the valid bit storage device 610. The optional delay circuitry 640 may be provided to perform such delay if necessary. It should be appreciated that the delay introduced by the optional delay circuitry 640 should not be so long as to affect a next compare operation, however.

Thus, in operation, the read wordline driver 530 is activated only on a match of the corresponding wordline to compare data. If there is a multiple hit condition, the read wordline drivers 530 would be active on all wordlines that contributed to the multiple hit condition. If the multiple hit signal 630 is triggered, the valid bit storage devices 610 on all wordlines that match the incoming compare data are cleared. As a result, subsequent comparisons for that wordline are either inhibited or the results of the comparisons are invalidated before activating the read wordline driver 530. In this way, the wordlines that were part of a multiple hit condition are not permitted to indicate a hit to the secondary storage table memory until reloaded.

At a later time, when the data processing device in which the associative memory is provided is idle or at a sufficiently low usage or activity rate, the wordline may be reloaded and the validity bit storage device 610 may be reset to a valid state. In this way, reloading of the associative memory may be delayed until a later time so as to avoid a negative affect on performance during times in which the data processing device is highly used. While such reloading is delayed, wordlines contributing to multiple hit conditions are invalidated such that their data cannot potentially corrupt the data returned to the data processing device.

Figure 7:
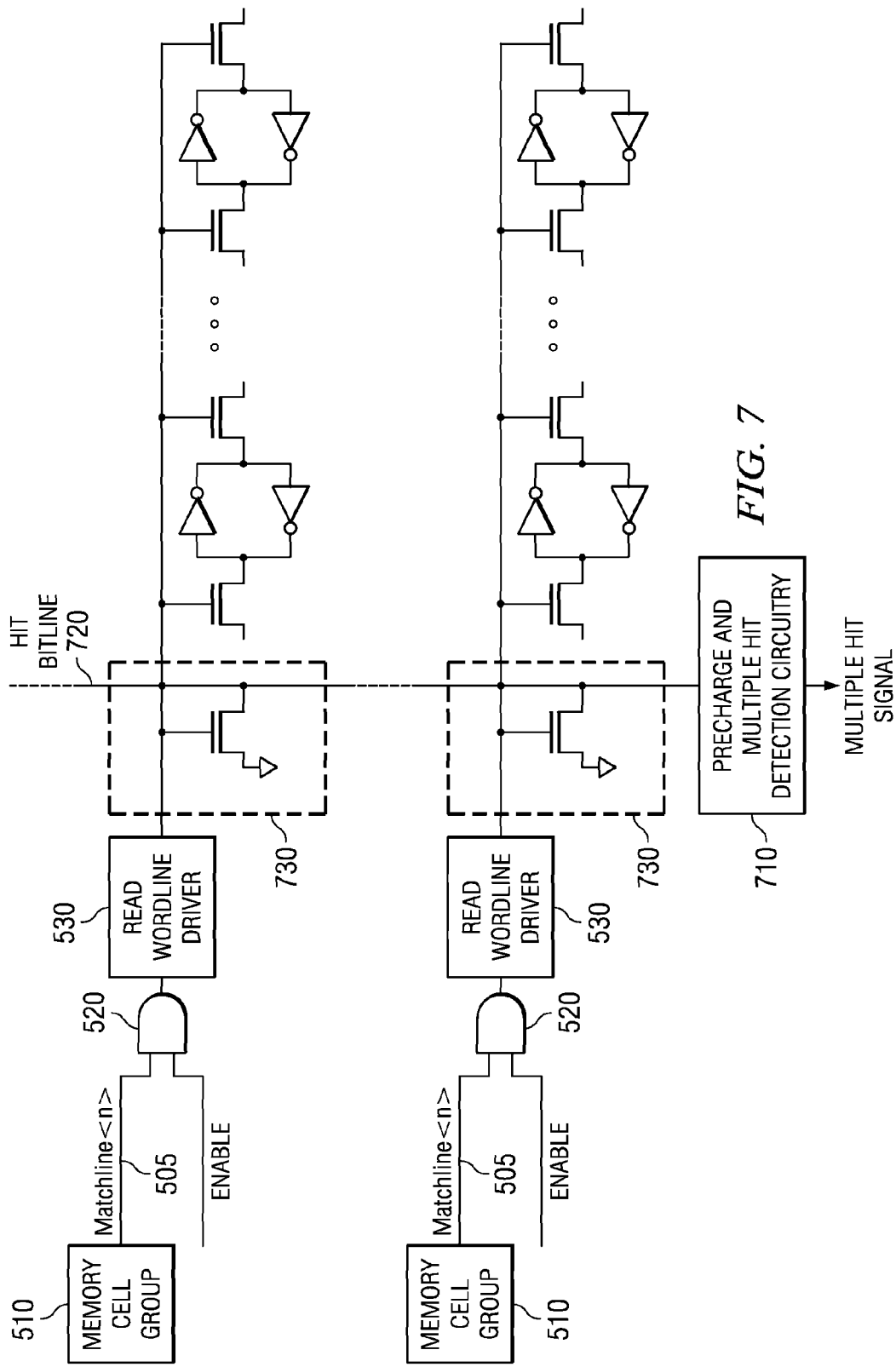
FIG. 7 is an exemplary diagram of a multiple hit detection mechanism that may be used in conjunction with the memory access structure of FIG. 6 in accordance with one illustrative embodiment.

With the above mechanism, it is beneficial for the multiple hit detection logic circuit to utilize a fast multiple hit detection scheme. FIG. 7 is an exemplary diagram of a multiple hit detection mechanism that may be used in conjunction with the memory access structure of FIG. 6 in accordance with one illustrative embodiment. For clarity, the circuit elements associated with the valid bit storage circuits of FIG. 6 are eliminated from FIG. 7. However, one of ordinary skill in the art can easily see how the elements of FIG. 7 and those of FIG. 6 may be combined to arrive at a circuit in which fast multiple hit detection is made possible and invalidation of wordlines contributing to the multiple hit condition may be performed.

With this mechanism, pre-charge and detection circuitry 710 are provided for pre-charging a hit bitline 720 to a logic high level (i.e. logic "1" state). The hit bitline 720 takes the output of the read wordline drivers 530 of each of the wordlines in the associative memory and provides an a resulting signal to the pre-charge and detection circuitry 710. With every read wordline driver that asserts a signal to read from the secondary storage table memory, the signal along the hit bitline 720 to the pre-charge and detection circuitry 710 is driven lower in voltage. This drop in voltage is made possible by way of the transistor elements 730. When this voltage drops below a predetermined level, a multiple hit condition may be detected by the pre-charge and detection circuitry 710. The detected multiple hit condition may then be communicated to the circuitry illustrated in FIG. 6 by asserting a multiple hit signal to the clear port 620, as previously described above.

It should be appreciated that the exemplary structure shown in FIG. 7 is only one example of a multiple hit detection mechanism that may be used with the illustrative embodiments. Any mechanism that is capable of detecting the occurrence of multiple hits in an associative memory may be used without departing from the spirit and scope of the present invention. Thus, many modifications to the structure shown in FIG. 7 may be made without departing from the spirit and scope of the present invention.

FIG. 8 is a flowchart outlining an exemplary operation of an associative memory in accordance with one illustrative embodiment. The operation outlined in FIG. 8 assumes that the associative memory is provided in a data processing device or system and that the associative memory has been populated with appropriate data for searching purposes.

As shown in FIG. 8, the operation starts with the associative memory receiving compare data (step 810). The associative memory compares the compare data to each group of memory cells in the associative memory (step 820) and outputs individual match line signals indicative of whether or not the data stored in a corresponding group of memory cells matches the compare data (step 830). The match line signals are received in hit logic (step 840) and a determination is made as to whether a single hit, multiple hits, or no hits are detected (step 850).

If no hits are detected, a miss is signaled to the system and no data is returned to the system (step 860). If a single hit is detected, a hit is signaled to the system and corresponding data from a secondary storage table memory is retrieved and returned to the system (step 870). If multiple hits are detected, a multi-hit is signaled to the system (step 880). The groups of memory cells in the associative memory contributing to the multiple hit condition are invalidated (step 890), and the data returned from the secondary storage table memory to the system is invalidated (step 900).

A determination is then made as to whether or not the associative memory may be reloaded (step 910). This determination may be made, for example, by determining if a current workload, usage, etc., of the system is below a predetermined threshold level. If so, the system may be considered to be idle or sufficiently unutilized to allow reloading of the associative memory without a significant performance degradation of the system. If reloading of the associative memory cannot be done at this time, the operation returns to step 810 and continues operation. If reloading of the associative memory can be done at this time, the groups of memory cells are reloaded and their validity bits are reset to indicate that all groups of memory cells are valid (step 920). The operation then terminates. It should be appreciated that the above operation may be repeated with each subsequent search of the associative memory.

It should be noted that in the above operation, when a group of memory cells is invalidated because of a detected multiple hit condition, if the associative memory is not reloaded, those groups of memory cells that are invalidated are not included in subsequent searches of the associative memory or their resulting match line outputs are zeroed, i.e. brought to a logic low level. In this way, groups of memory cells that may erroneously indicate a hit in the associative memory are prevented from further corrupting data output by the secondary storage table memory.

Thus, the illustrative embodiments provide mechanisms by which multiple hits in an associative memory may be detected and handled in an efficient manner. The mechanisms of the illustrative embodiments allow individual groups of memory cells in the associative memory, i.e. rows or wordlines, to be invalidated and not included in subsequent searches of the associative memory. As a result, data corruption is minimized while delaying reloading of the associative memory until a time at which such reloading will not result in a large performance degradation of the system or device in which the associative memory is provided.

The circuit as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case the chip may then be integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, for handling multiple hits of an associative memory, comprising:
   receiving, from a data processing device, compare data in the associative memory;
   detecting if a multiple hit condition in which more than one hit condition occurs in the associative memory, a hit condition being a condition in which data values stored in a group of memory cells in the associative memory matches the compare data;
   reading out data to the data processing device from a secondary storage area in response to any hit condition occurring;
   outputting a multiple hit signal to the data processing device in response to the multiple hit condition occurring to thereby inform the data processing device that a multiple hit condition has been detected;
   setting, for each individual group of memory cells in the associative memory that contributed to the multiple hit condition, a valid bit to an invalid state indicating an associated group of memory cells is invalid; and
   preventing, based on the setting of the valid bits, individual groups of memory cells whose valid bits are set to an invalid state from indicating a hit in subsequent searches of the associative memory.

2. The method of claim 1, wherein detecting if the multiple hit condition occurs in the associative memory comprises detecting whether more than one matchline of the associative memory remains at a high voltage state after comparing the compare data to the data values stored in the group of memory cells of the associative memory.

3. The method of claim 1, further comprising:
   invalidating, in the data processing device, data read out of the secondary storage in response to receiving the multiple hit signal.

4. The method of claim 1, further comprising:
   reloading the associative memory; and
   resetting the valid bits associated with each group of memory cells in the associative memory to indicate a valid state in response to reloading of the associative memory.

5. The method of claim 4, wherein the reloading of the associative memory is performed in response to determining that the data processing device is one of idle or at a sufficiently low usage level.

6. The method of claim 1, wherein the associative memory is a content addressable memory (CAM).

7. An associative memory device, comprising:
   a plurality of groups of memory cells;
   a plurality of valid bit storage devices, one valid bit storage device associated with each group of memory cells in the plurality of groups of memory cells;
   multiple hit detection logic coupled to the plurality of groups of memory cells;
   a secondary storage coupled to the associative memory device; and
   invalidation logic coupled to the valid bit storage devices associated with the groups of memory cells, wherein:
   compare data is received in the associative memory from a data processing system device,
   the multiple hit detection logic detects a multiple hit condition if more than one hit condition occurs in the associative memory, a hit condition being a condition in which data values stored in a group of memory cells, of the plurality of groups of memory cells in the associative memory, matches the compare data,
   the secondary storage reads out data to the data processing system device in response to any hit condition occurring;
   the multiple hit detection logic outputs a multiple hit signal to the data processing system device in response to the multiple hit condition occurring to thereby inform the data processing device with which the associative memory is associated that a multiple hit condition has been detected;
   the invalidation logic sets a valid bit for each individual group of memory cells in the associative memory that contributes to the multiple hit condition, in an associated valid bit storage device, to an invalid state indicating that the associated group of memory cells is invalid, and
   based on the setting of the valid bits, individual groups of memory cells whose valid bits are set to an invalid state are prevented from indicating a hit in subsequent searches of the associative memory.

8. The associative memory device of claim 7, wherein the multiple hit detection logic detects the multiple hit condition by detecting whether more than one matchline of the associative memory remains at a high voltage state after comparing the compare data to the data values stored in the group of memory cells of the associative memory.

9. The associative memory device of claim 7, wherein the data processing device invalidates data read out of the secondary storage in response to receiving the multiple hit signal.

10. The associative memory device of claim 7, wherein the associative memory is reloaded and the valid bits associated with each group of memory cells in the plurality of groups of memory cells are reset to indicate a valid state in response to reloading of the associative memory.

11. The associative memory device of claim 10, wherein the reloading of the associative memory is performed in response to determining that a data processing device with which the associative memory is associated is one of idle or at a sufficiently low usage level.

12. The associative memory device of claim 7, wherein the associative memory is a content addressable memory (CAM).

13. A data processing device, comprising:
   a processor; and an associative memory coupled to the processor, wherein the associative memory comprises logic that causes the associative memory to:

receive, from the data processing device, compare data in the associative memory;

detect if a multiple hit condition in which more than one hit condition occurs in the associative memory, a hit condition being a condition in which data values stored in a group of memory cells in the associative memory matches the compare data;

read out data to the data processing device from a secondary storage area in response to any hit condition occurring;

output a multitple hit signal to the data processing device in response to the multiple hit condition occurring to thereby inform the data processing device that a multiple hit condition has been detected;

set, for each individual group of memory cells in the associative memory that contributed to the multiple hit condition, a valid bit to an invalid state indicating an associated group of memory cells is invalid; and prevent, based on the setting of the valid bits, individual groups of memory cells whose valid bits are set to an invalid state from indicating a hit in subsequent searches of the associative memory.

14. The data processing device of claim 13, wherein the logic for detecting the multiple hit condition in the associative memory comprises logic for detecting whether more than one matchline of the associative memory remains at a high voltage state after comparing the compare data to the data values stored in the group of memory cells of the associative memory.

15. The data processing device of claim 13, wherein the processor invalidates data read out of the secondary storage in response to receiving the multiple hit signal.

16. The data processing device of claim 13, wherein the processor:

reloads the associative memory; and resets the valid bits associated with each group of memory cells in the associative memory to indicate a valid state in response to reloading of the associative memory.

17. The data processing device of claim 16, wherein the reloading of the associative memory is performed in response to determining that the data processing device is one of idle or at a sufficiently low usage level.

18. The data processing device of claim 16, wherein the associative memory is a content addressable memory (CAM).

* * * * *